United States Patent
Lee et al.

(10) Patent No.: US 6,713,840 B1
(45) Date of Patent: Mar. 30, 2004

(54) METAL-INSULATOR-METAL DEVICE STRUCTURE INSERTED INTO A LOW K MATERIAL AND THE METHOD FOR MAKING SAME

(75) Inventors: Charles C. C. Lee, Jubei (TW); Chi-Hsi Wu, Hsin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 17 days.

(21) Appl. No.: 10/375,489

(22) Filed: Feb. 27, 2003

(51) Int. Cl.[7] .............................................. H01L 29/00
(52) U.S. Cl. ...................................... 257/535; 257/532
(58) Field of Search .......................... 257/296, 300, 257/306, 532, 535

(56) References Cited

U.S. PATENT DOCUMENTS 6,573,587 B1 * 6/2003 Igarashi ...................... 257/532
2002/0074601 A1 * 6/2002 Fox et al. .................... 257/350
2003/0146492 A1 * 8/2003 Malinowski et al. ........ 257/532

* cited by examiner

Primary Examiner—Ngân V. Ngô
(74) Attorney, Agent, or Firm—Haynes and Boone, LLP

(57) ABSTRACT

The present disclosure provides a metal-insulator-metal (MIM) device structure inserted in a low-k material and the method for forming same. The low-k material has a first low-k material layer at the bottom of the MIM device structure and a second low-k material layer on top thereof. The structure further comprises a first sealing layer on top of the first low-k material layer; an out gas sealing layer on top of the first sealing layer; and a device such as a capacitor formed on top of the out gas sealing layer, the capacitor having a dielectric layer, a top plate, and a bottom plate, wherein the dielectric layer has a center portion having the same width as the top plate, and two extended portions, each with a predetermined minimum thickness.

25 Claims, 11 Drawing Sheets

METAL-INSULATOR-METAL DEVICE STRUCTURE INSERTED INTO A LOW K MATERIAL AND THE METHOD FOR MAKING SAME

BACKGROUND OF THE INVENTION

The present disclosure relates generally to the fabrication of a metal-insulator-metal (MIM) device structure and more particularly, inserting an MIM structure in a low-k material.

The increasing popularity of electronic equipment, such as computers for example, is increasing the demand for large semiconductor electronic circuits. One example is a large semiconductor memory. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flows into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to their low cost per bit, high device density and flexibility of use concerning reading and writing operations.

Capacitors are critical components in the ICs such as the DRAM of today. These passive components are often to be integrated with active bipolar or MOS transistors for analog and digital circuits. Examples of capacitors used in the art are: polysilicon-insulator-polysilicon (PIP), polysilicon-insulator-polycide, polysilicon-insulator-metal MIS), and metal-insulator-metal (MIM) capacitors. Early DRAMs used storage cells each consisting of three transistors and were manufactured using P type channel metal-oxide-semiconductor (PMOS) technology. Later, a DRAM storage cell structure consisting of one transistor and one capacitor was developed. For mixed signal devices of 0.13 nanometers and below, copper damascene processes are usually used for high performance.

In devices that uses a low-k material, especially in the conventional method for manufacturing an MIM structure, the MIM structure is processed on the top of metal layers or far from low-k films. It is technically difficult to insert an MIM structure into a low-k material.

What is needed is a method and system for-manufacturing electric devices such as a capacitor embedded within a low-k material.

SUMMARY

A metal-insulator-metal capacitor (MIM) structure inserted in a low-k material and the method for forming same is disclosed. The low-k material has a first low-k material layer at the bottom of the MIM structure and a second low-k material layer on top of the MIM structure. The MIM structure further comprises a first sealing layer on top of the first low-k material layer, an out gas sealing layer on top of the first sealing layer; and a device such as a capacitor formed on top of the out gas sealing layer, the capacitor having a dielectric layer, a top plate, and a bottom plate, wherein the dielectric layer has a center portion having the same width as the top plate, and two extended portions, each with a predetermined width and a predetermined minimum thickness.

In one example, the etch stop layer on top of the capacitor reaches down to the out gas sealing layer so as to enclose the capacitor within these two layer of materials. In another example, the etch stop layer only reaches where the dielectric layer is.

Therefore, in accordance with the previous summary, objects, features and advantages of the present disclosure will become apparent to one skilled in the art from the subsequent description and the appended claims taken in conjunction with the accompanying drawings.

DETAILED DESCRIPTION OF THE PREFERRED EMBODIMENTS

The present disclosure describes several embodiments given below. It is understood, however, that the embodiments below are not necessarily limitations to the present disclosure, but are used to describe a sample implementation. The illustrations use an MIM capacitor embedded in a low-k material as an example. The first and second embodiments describe how such a capacitor can be formed using the techniques and processes contemplated by the present disclosure. However, the same techniques and processes could-be used to form other electrical devices that needs to be inserted in the low-k material.

Figure 1:
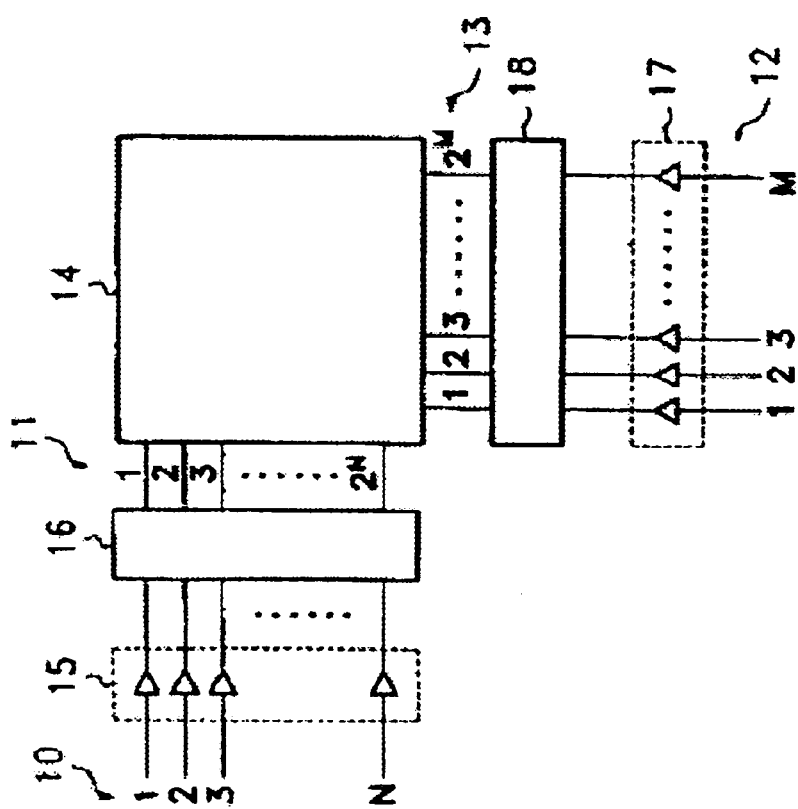
FIG. 1 illustrates a simplified diagram of the organization of a typical large semiconductor memory.
Figure 2:
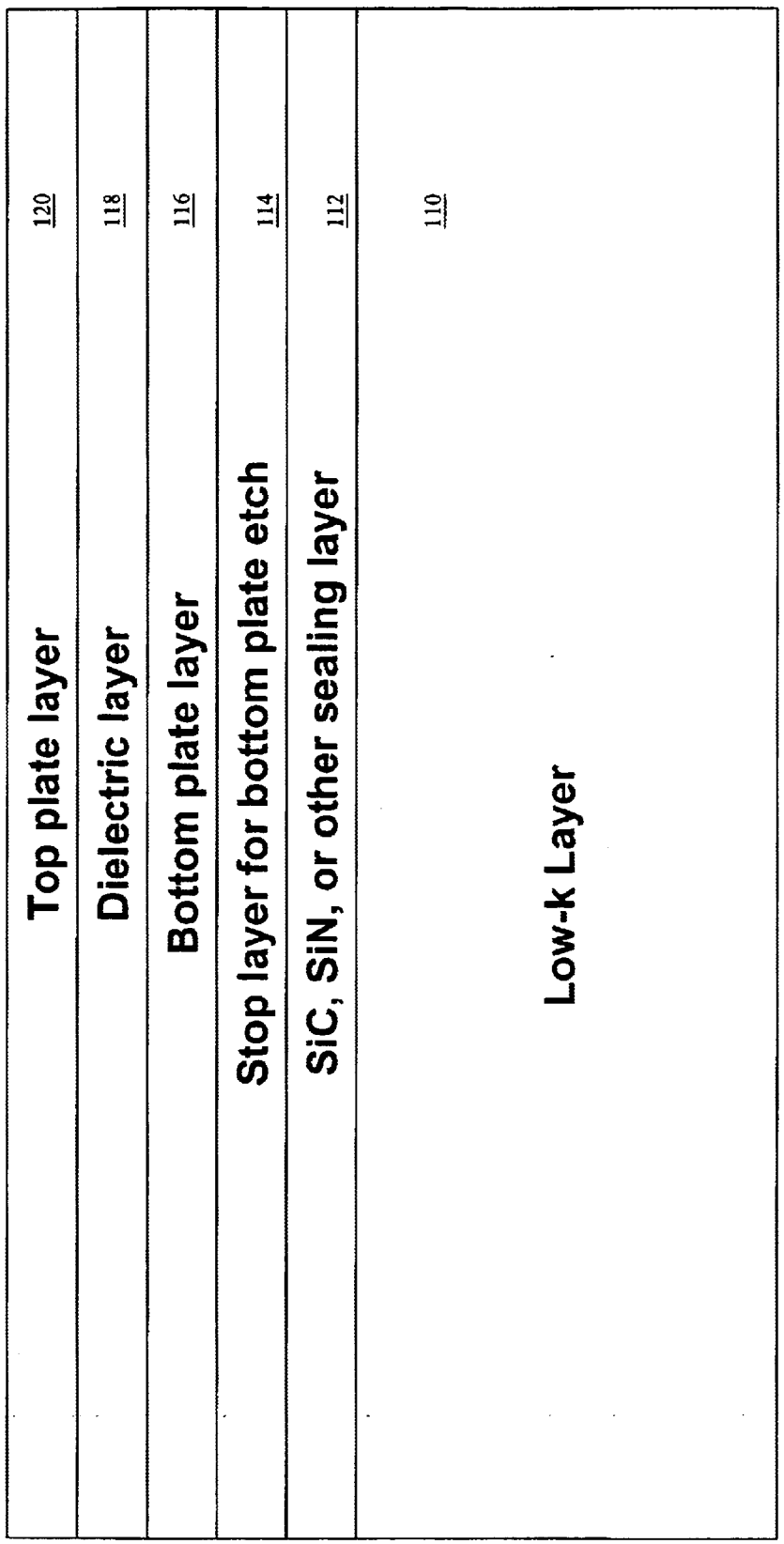
FIGS. 2–6 illustrate the process steps of one example of the present disclosure.

FIG. 2 illustrates some of the first process steps of one embodiment of the invention. First, a SiC, SiN or other sealing layer 112 in a damanscene/low-k process is deposited on top of a low-k layer 110. An out gas sealing layer or stop layer 114 is then deposited over the sealing layer at about 20 nm up to about 100 nm; this stop layer 114 should possess high selectivity, or at least lager than the bottom plate material 116. The stop layer 114 is also referred to as an out gas sealing layer because it seals off the chemical gases coming from the low-k material layer 110. This stop layer 114 can also serve as an etch barrier for the bottom plate. However, another implementation could include a material for the sealing layer 112 that would also act as the stop layer.

Then, a bottom plate layer 116 is deposited on top of the stop layer 114. The material bottom plate 116 in this embodiment is TiN, TaN or other metal compound or alloy. The late 116 is also between about 20 nm to 100 nm.

A dielectric layer 118 is then deposited on top of the bottom plate 16 at about 10 nm to about 50 nm. The dielectric layer 118 in this embodiment SiN, SiO, or other dielectric material.

Then, a top plate layer 120 is deposited on top of the dielectric layer 118. The for the top plate 120 in this embodiment is also TiN, TaN or other metal compound or he top plate 120 is also between about 20 nm to 100 nm.

Figure 3:
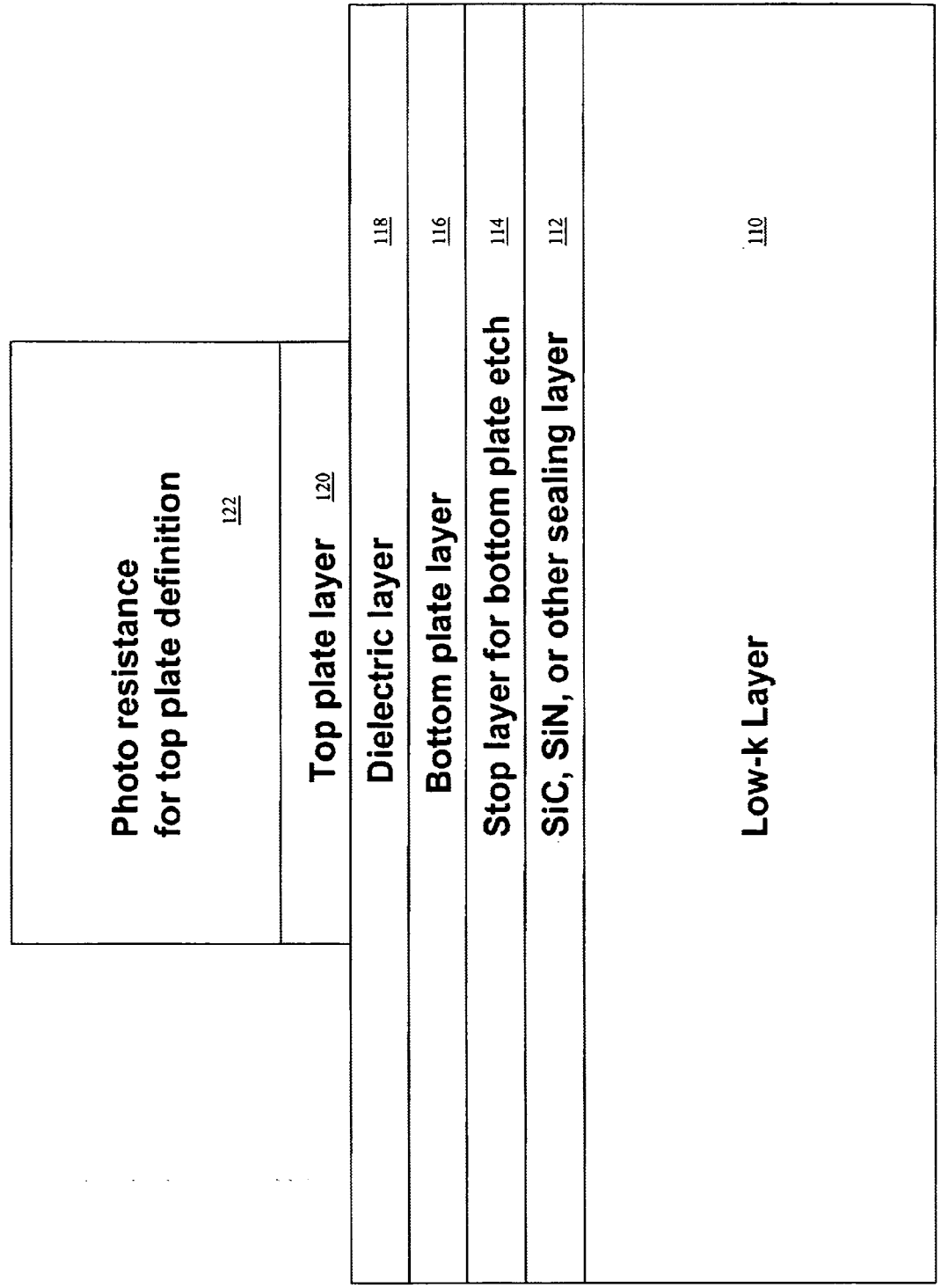

A photo resist mask 122 then defines the top plate 120 as illustrated in FIG. 3. Photo phy is then used to etch the top plate 122. As shown, generally the dielectric layer 118 is also etched slightly.

Figure 4:
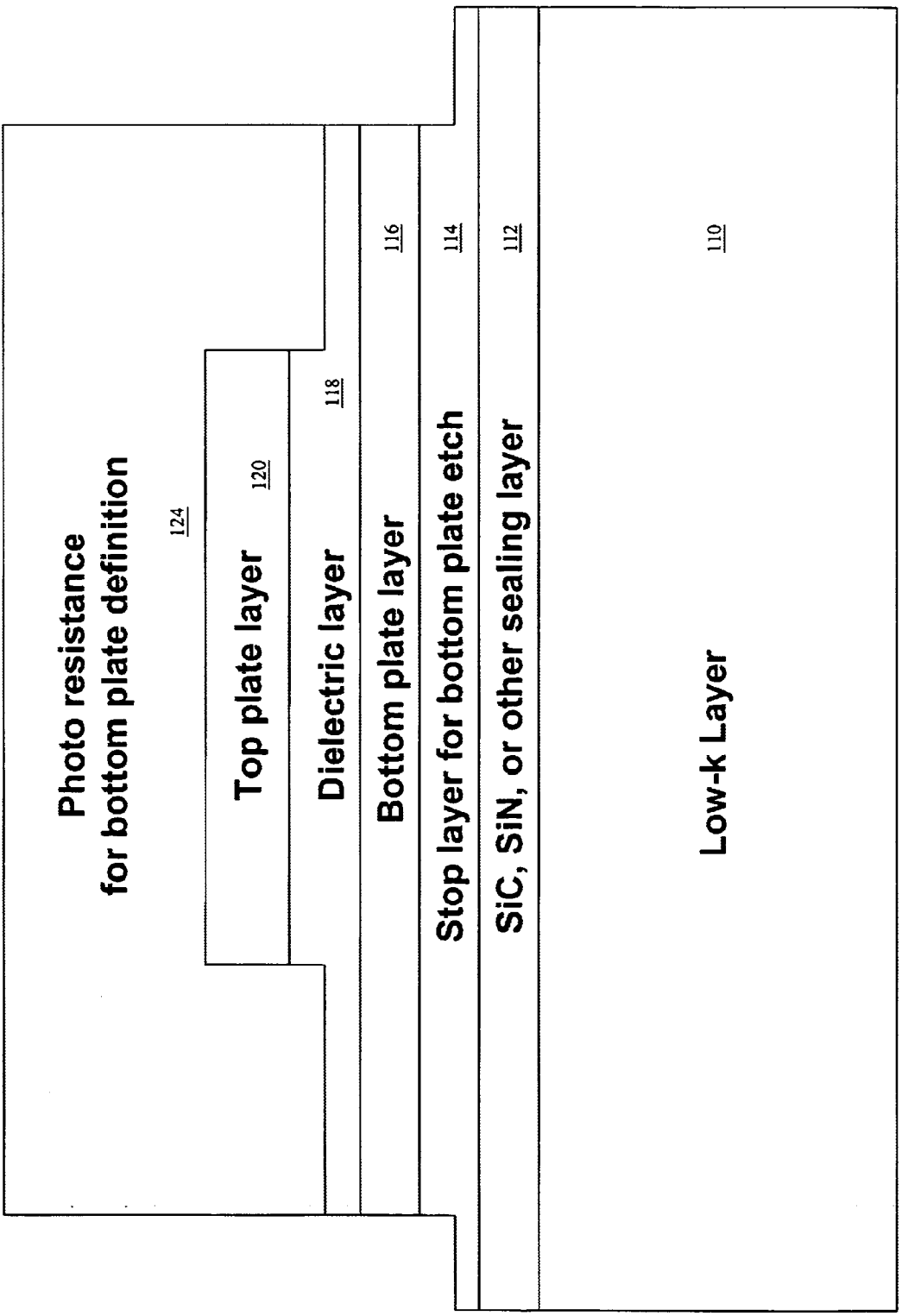

Another photo resist mask 124 is then used to define the bottom plate 11 6 in FIG. 4. Photo lithography is then also used to etch the bottom plate 116. As shown, generally the stop layer 114 is also etched slightly. As such, the dielectric layer 118 can be viewed to have a center portion that has the same width as the top plate 120 and two extended portions at the two ends, each having a predetermined thickness and width. The minimum thickness of the extended portion, which is thinner than the center portion as shown, may need to be greater than 50 Å. This structure helps to cut off possible electric leakage paths.

Figure 5:
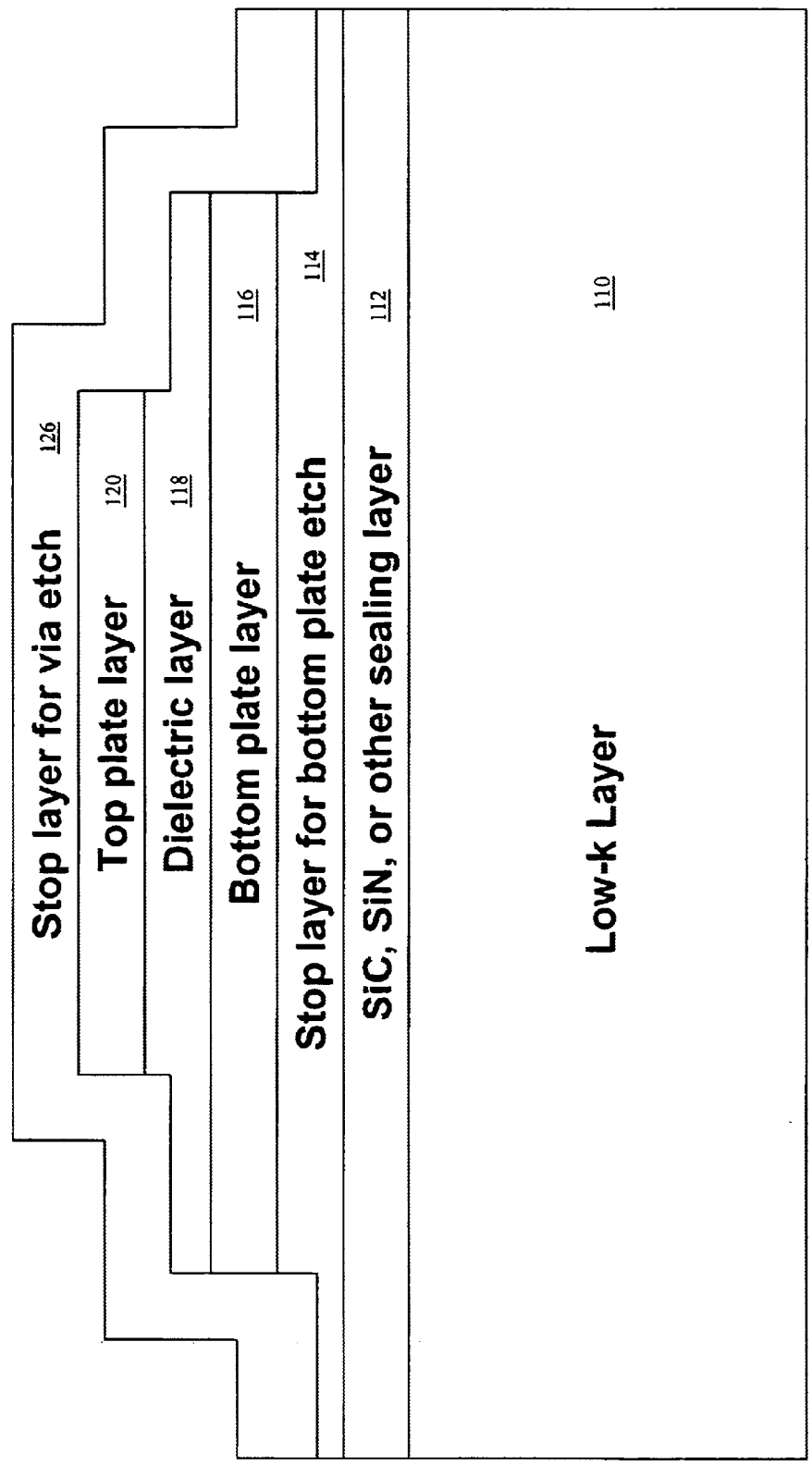

As shown in FIG. 5, another stop layer 126 is then deposited on top of the top plate 120, the dielectric layer 118, the bottom plate 116 and the stop layer 114 for the bottom plate etch. This stop layer 126 is used to as a stop layer for a later via etch. This stop layer 126 also possess high selectivity, or at least larger than selectivity of the low-k layer 110. In this embodiment, the MIM capacitor (MIMC) structure can be considered to include the bottom plate 116, the dielectric layer 118, and the top plate 120. The MIM structure could be considered to include the MIMC and other related material layers as demonstrated.

Figure 6:
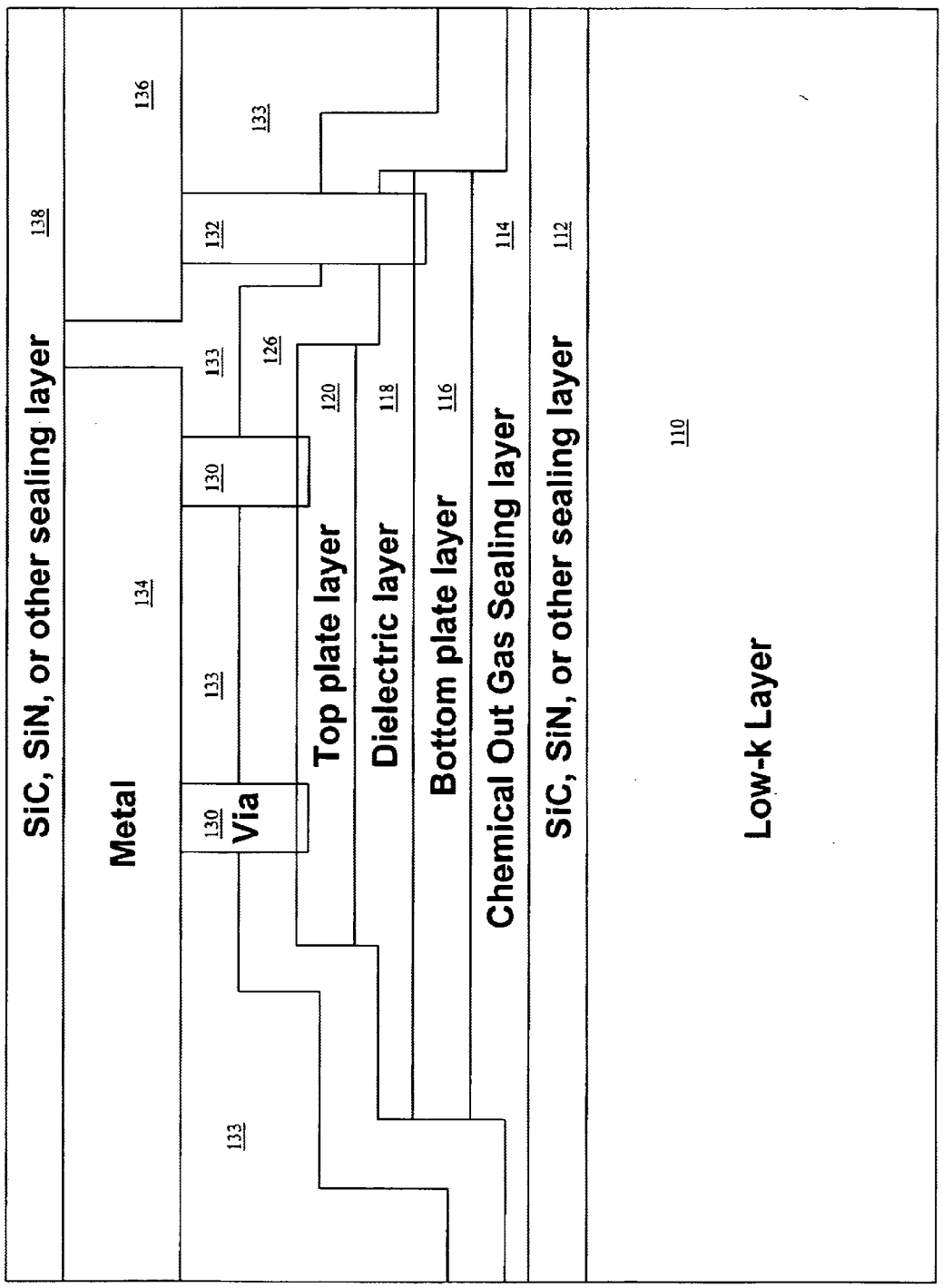

Now turning to FIG. 6, the process then proceeds with depositing and etching the appropriate vias 130, 132 that connect to the top 122 and bottom 128 plates as well as the appropriate interconnects 134, 136 and another low-k layer 133. Therefore, the MIMC is successfully inserted in the low-k material (e.g., between two low-k layers) A SiC, SiN or other sealing layer 138 is then deposited on top of metal layers 134, 136 to finish up other electronic devices such as another capacitor.

Figure 7:
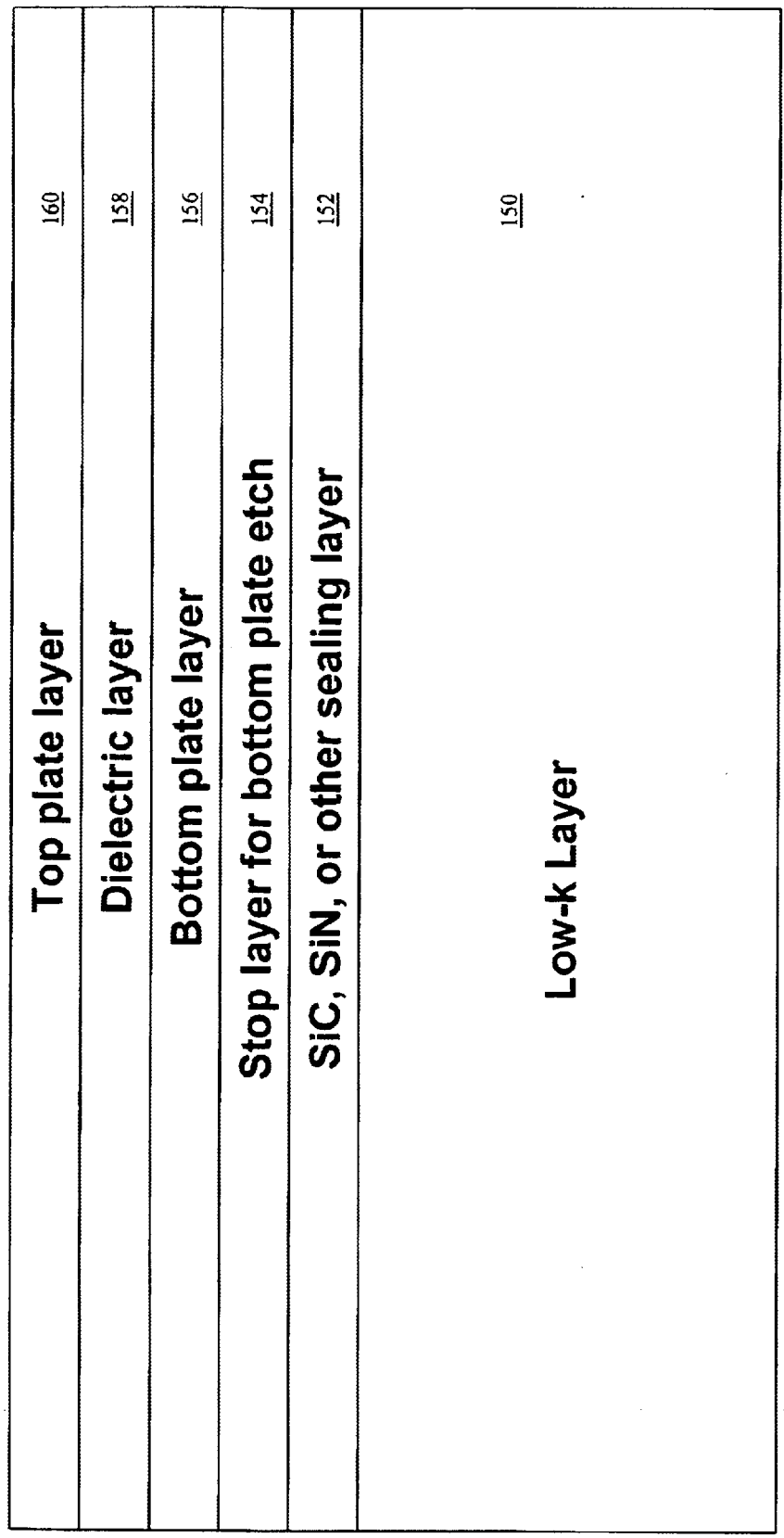
FIGS. 7–11 illustrate the process steps of another example of the present disclosure.

Another embodiment is illustrated starting on FIG. 7. First, a SiC, SiN or other sealing layer 152 in damanscene/low-k process is deposited on top of a low-k layer 150. A stop layer 154 is then deposited over the sealing layer at about 20 nm up to about 100 nm; this stop layer 154 should have the same characteristics as the stop layer 114 in previous figures. It possess high selectivity, or at least larger than the bottom plate material 156. It seals off chemical out gases from below, and may also serve as an etch stop layer.

Then, a bottom plate layer 156 is deposited on top of the stop layer 152. The material for the bottom plate 156 in this embodiment is TiN, TaN or other metal compound or alloy. The bottom plate 156 is also between about 20 nm to 100 nm.

A dielectric layer 158 is then deposited on top of the bottom plate 156 at about 10 nm to about 50 nm. The dielectric layer 158 in this embodiment SiN, SiO, or other dielectric material.

Then, a top plate layer 160 is deposited on top of the dielectric layer 158. The material for the top plate 160 in this embodiment is also TiN, TaN or other metal compound or alloy. The top plate 160 is also between about 20 nm to 100 nm.

Figure 8:
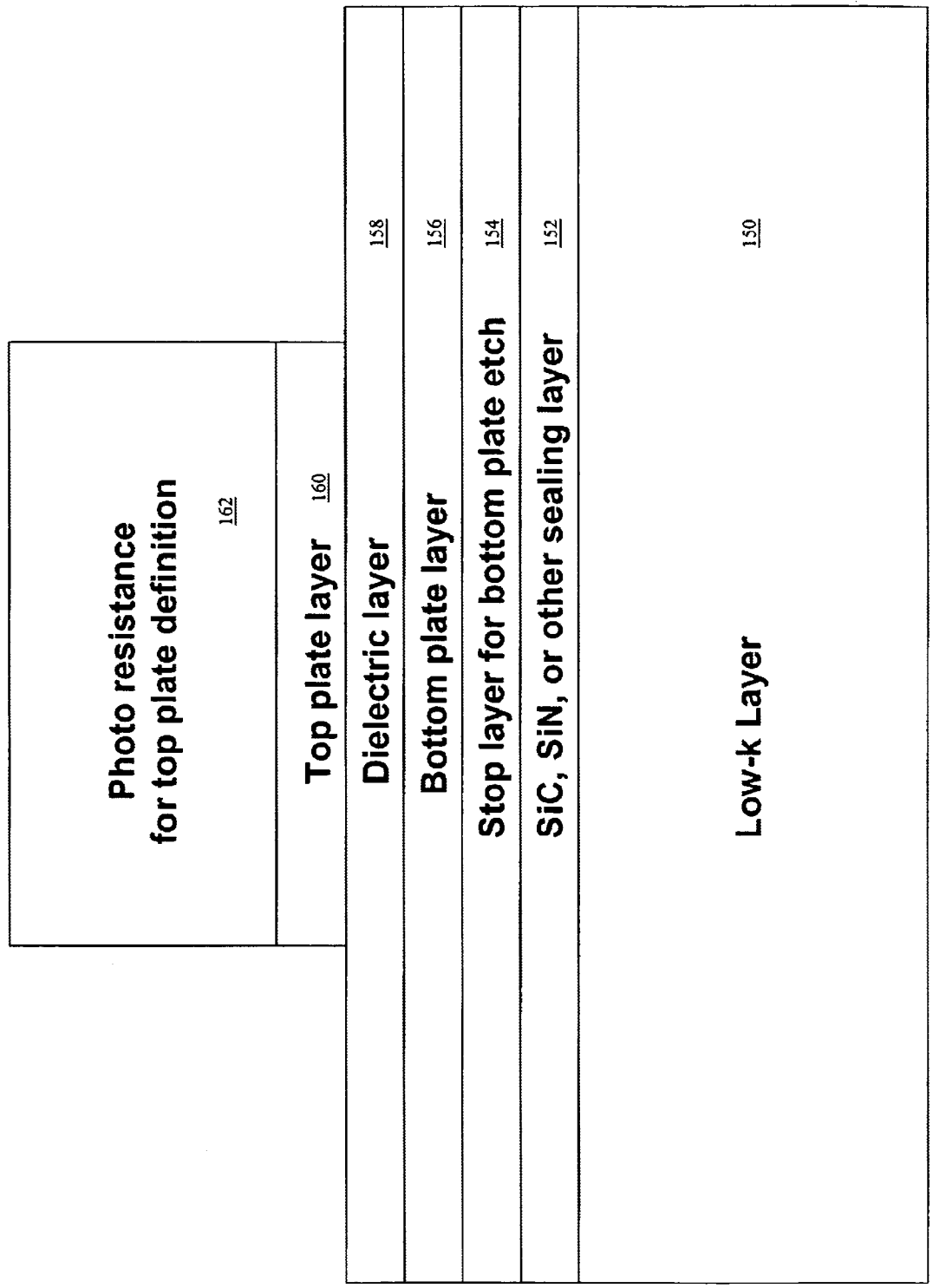

A photo resist mask 162 then defines the top plate 160 as illustrated in FIG. 8. Photo lithography is then used to etch the top plate 162. As shown, generally the dielectric layer 158 is also etched slightly. As such, the dielectric layer 158 can be viewed to have a center portion that has the same width as the top plate 160 and two extended portions at the two ends, each having a predetermined thickness and width. The minimum thickness of the extended portion, which is thinner than the center portion as shown, may need to be greater than 50 Å. This structure helps to cut off possible electric leakage paths.

Figure 9:
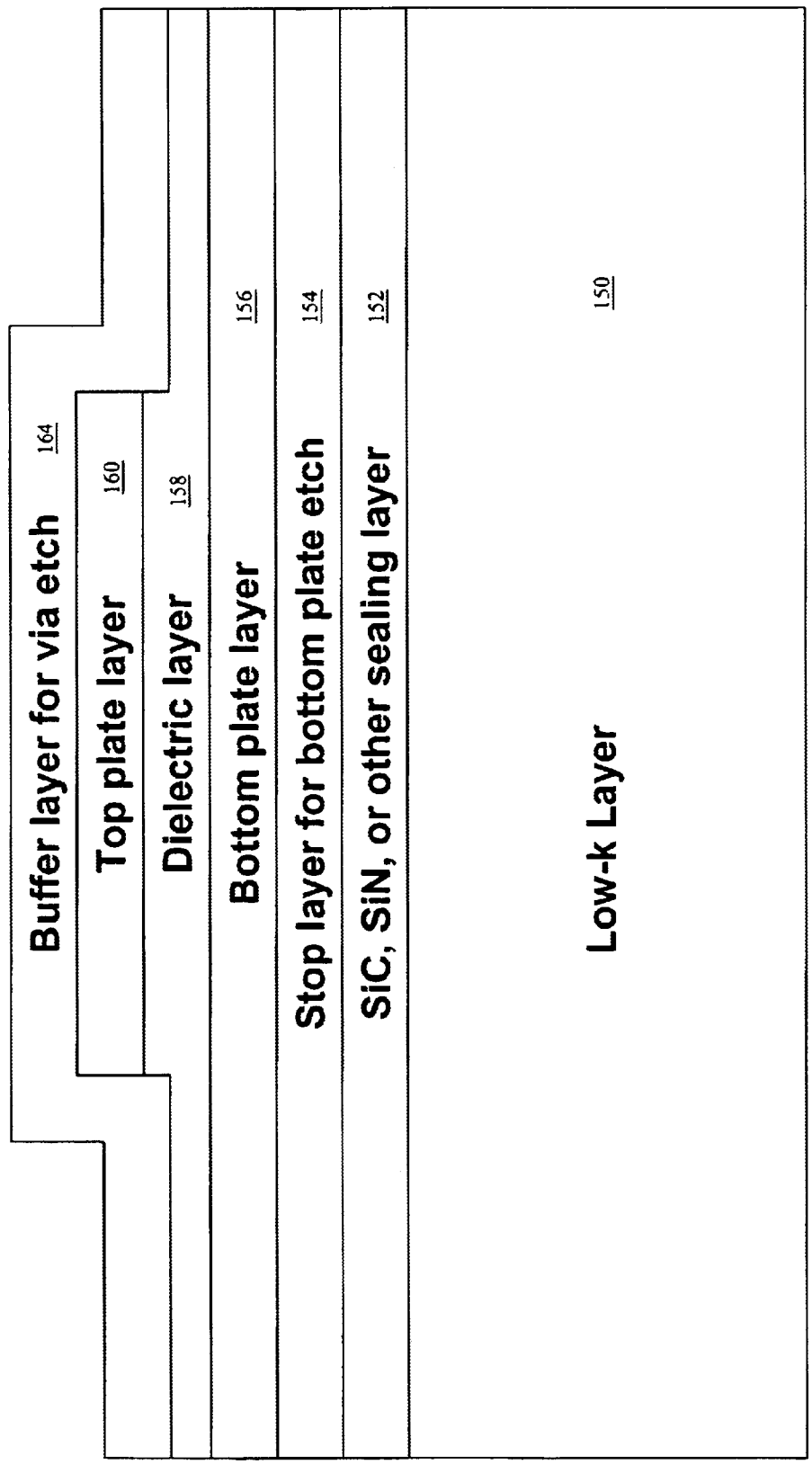

As shown in FIG. 9, another etch stop layer or buffer layer 164 is then deposited on lop of the top plate 160, and the dielectric layer 158. This etch stop layer 164 is used to as a stop layer for a later via etch process. The material used in this embodiment may include anti-reflective coating. The etch stop layer 164 also possess high selectivity, or at least larger than selectivity of the low-k layer 110. As shown, the etch stop layer 164 does not reach all the way to the etch stop layer for the bottom plate 154. It only cuts into the dielectric layer 158 and stops therein.

Figure 10:
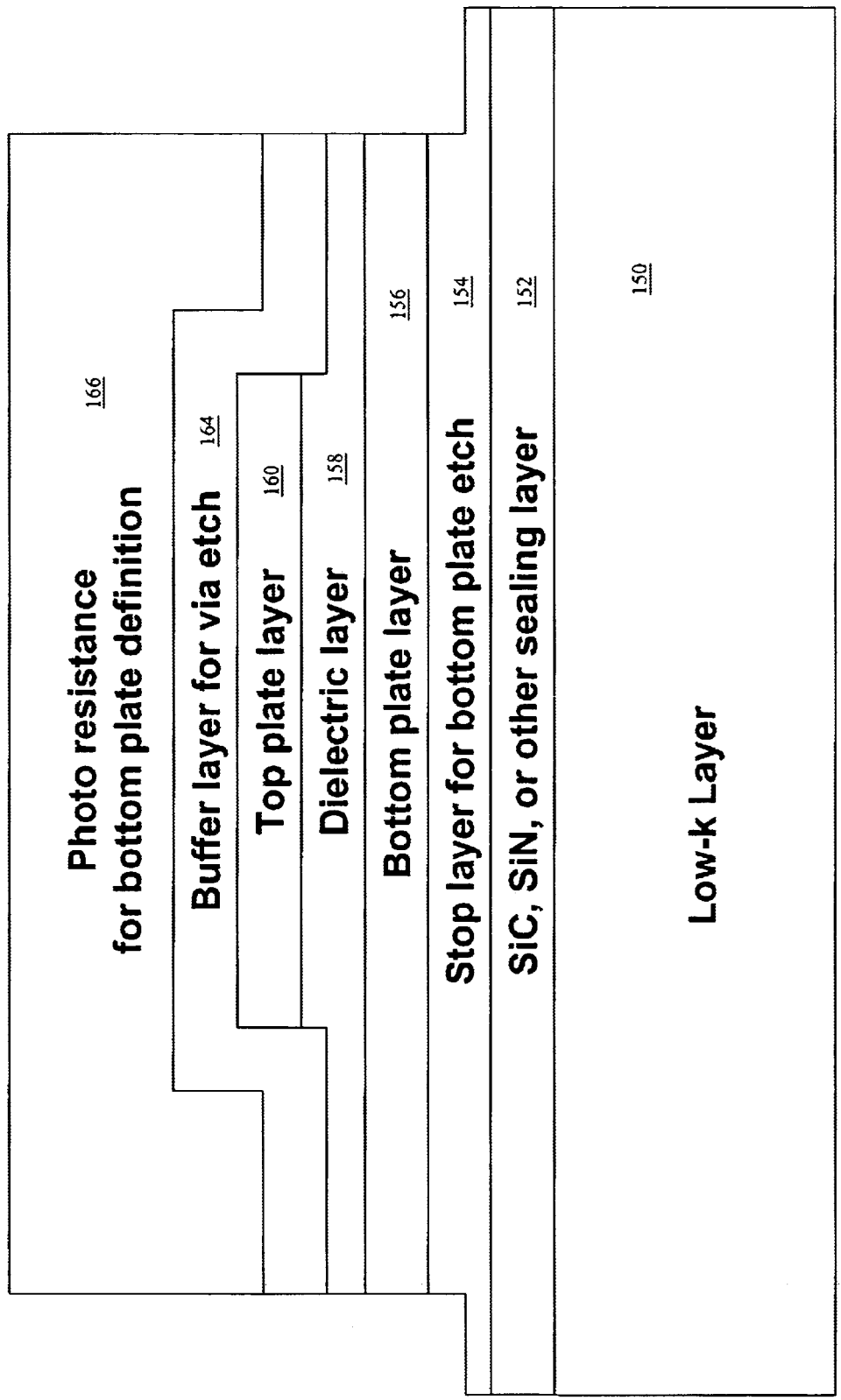

Another photo resist mask 166 is then used to define the bottom plate 156 in FIG. 10. Photo lithography is then also used to etch the bottom plate 156. As shown, generally the etch stop layer 154 is also etched slightly wherein the low-k material can be deposited over the etched etch stop layer 154.

Figure 11:
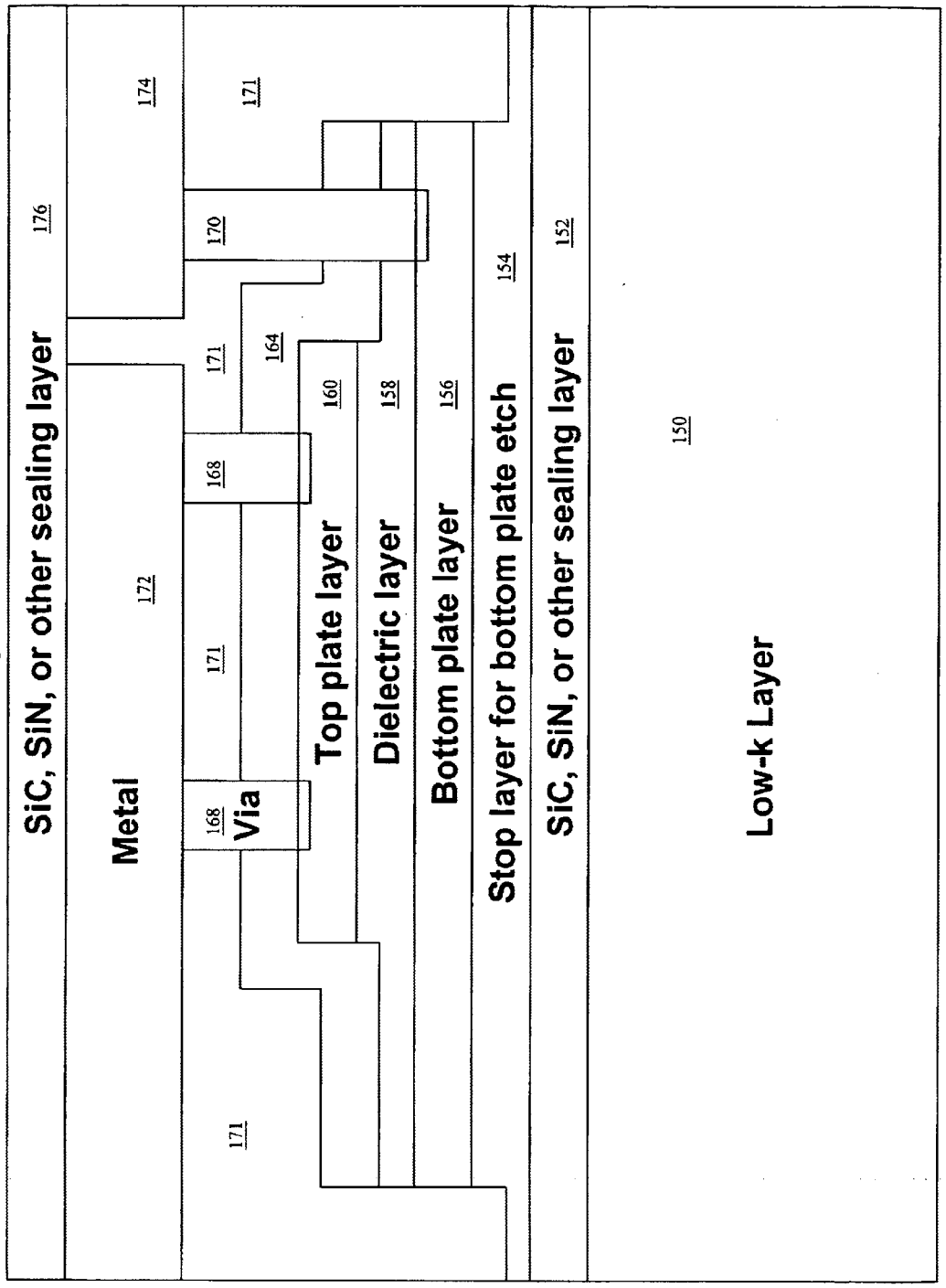

Now turning to FIG. 11, the process then proceeds with depositing and etching the appropriate vias 168, 170 that connect to the top 160 and bottom 158 plates as well as the appropriate interconnects 172, 174 and another low-k layer 171. A SiC, SiN or other sealing layer 176 is then deposited on top of metal layers 172, 174 to finish up the MIMC.

The MIM structure as described above can be inserted in the low-k material without compromising the device quality and reliability. It thus solves the technical difficulty for embedding or inserting the MIM structure in the low-k material.

It is understood that several modifications, changes and substitutions are intended in the foregoing disclosure and in some instances some features of the invention will be employed without a corresponding use of other features. For example, other structures could formed using the techniques and embodiments disclosed. In addition, the MIM structures can be formed in other types of electronic circuits other than memories by the concepts in the embodiments illustrated. Accordingly, it is appropriate that the appended claims be construed broadly and in a manner consistent with the scope of the disclosure.

What is claimed is:

1. A method for forming inserting a metal-insulator-metal (MIM) structure in a low-k material, the low-k material having a first low-k material layer at the bottom of the MIM and a second low-k material layer on top of the MIM, the method comprising:

forming a first sealing layer on top of the first low-k material layer;

forming an out gas sealing layer on top of the first sealing layer; and forming a capacitor on top of the out gas sealing layer, the MIM having a dielectric layer, a top plate, and a bottom plate, wherein the dielectric layer has a center portion having about the same width as the top plate, and two extended portions, each with a predetermined minimum thickness.

2. The method of claim 1 further comprising forming an etch stop layer on top of the capacitor but below the second low-k material layer, wherein two edges of the etch stop layer are aligned with the edges of the dielectric layer.

3. The method of claim 1 further comprising forming an etch stop layer on top of the capacitor but below the second low-k material layer, wherein the etch stop layer reaches into the dielectric layer.

4. The method of claim 1 further comprising forming an etch stop layer on top of the capacitor but below the second low-k material layer, wherein the etch stop layer extends to reach the out gas sealing layer so as to enclose the capacitor therein by the etch stop layer and the out gas sealing layer.

5. The method of claim 1 wherein forming the out gas layer includes depositing a material with a high selectivity and with a thickness greater than 20 nm.

6. The method of claim 1 wherein the top or bottom plate has a thickness ranging from about 20 to 100 nm.

7. The method of claim 1 wherein the minimum thickness of the extended portion of the dielectric layer is 50 Å.

8. The method of claim 1 further comprising forming one or more connection structures through the etch stop layer to reach the top, bottom or dielectric layer.

9. A metal-insulator-metal capacitor (MIMC) structure inserted in a low-k material, the low-k material having a first low-k material layer at the bottom of the MIMC and a second low-k material layer on top of the MIMC, the structure comprising:

a first sealing layer on top of the first low-k material layer;

an out gas sealing layer on top of the first sealing layer; and a capacitor formed on top of the out gas sealing layer, the capacitor having a dielectric layer, a top plate, and a bottom plate, wherein the dielectric layer has a center portion having about the same width as the top plate, and two extended portions, each with a predetermined width and a predetermined minimum thickness, and wherein an overall width of the dielectric layer is the same as that of the bottom plate.

10. The structure of claim 9 further comprising an etch stop layer on top of the capacitor but below the second low-k material layer, wherein two edges of the etch stop layer are aligned with the edges of the dielectric layer.

11. The structure of claim 9 further comprising an etch stop layer on top of the capacitor but below the second low-k material layer, wherein the etch stop layer reaches into the dielectric layer.

12. The structure of claim 9 further comprising an etch stop layer on top of the capacitor but below the second low-k material layer, wherein the etch stop layer extends to reach the out gas sealing layer so as to enclose the capacitor therein by the etch stop layer and the out gas sealing layer.

13. The structure of claim 9 wherein the first sealing layer includes SiN or SiC.

14. The structure of claim 9 wherein the out gas layer includes a material with a high selectivity and with a thickness greater than 20 nm.

15. The structure of claim 9 wherein the bottom plate and the top plate include metal compounds or metal alloys.

16. The structure of claim 9 wherein the bottom plate and the top plate each has a thickness greater than 20 nm.

17. The structure of claim 9 wherein the dielectric layer has a thickness greater than 10 nm.

18. The structure of claim 9 wherein the etch stop layer includes a material with an anti-reflective coating and a high selectivity.

19. The structure of claim 9 wherein the minimum thickness of the extended portion of the dielectric layer is 50 Å.

20. A metal-insulator-metal device (MIM) structure inserted in a low-k material, the low-k material having a first low-k material layer at the bottom of the MIM device structure and a second low-k material layer on the top thereof, the structure comprising:

a first sealing layer on top of the first low-k material layer;

an out gas sealing layer on top of the first sealing layer; and an electronic device formed on top of the out gas sealing layer, the device having at least one dielectric layer, and an etch stop layer on top of the electronic device but below the second low-k material layer, wherein the dielectric layer has a center portion and two extended portions, and wherein the extended portions each has a predetermined thickness that is smaller than that of the center portion and covered by the etch stop layer.

21. The structure of claim 20 wherein two edges of the etch stop layer are aligned with the edges of the dielectric layer.

22. The structure of claim 20 further wherein the etch stop layer extends to reach the out gas sealing layer so as to enclose the electronic device therein by the etch stop layer and the out gas sealing layer.

23. The structure of claim 20 wherein the out gas sealing layer includes a material with a high selectivity and with a thickness greater than 20 nm.

24. The structure of claim 20 wherein the dielectric layer has a thickness greater than 10 nm.

25. The structure of claim 20 wherein the minimum thickness of the extended portion of the dielectric layer is 50 Å.

\* \* \* \* \*

UNITED STATES PATENT AND TRADEMARK OFFICE
CERTIFICATE OF CORRECTION

PATENT NO.   : 6,713,840 B1
DATED        : March 30, 2004
INVENTOR(S)  : Charles C. C. Lee et al.

It is certified that error appears in the above-identified patent and that said Letters Patent is hereby corrected as shown below:

Column 2,
Line 52, the word "lager" should be replaced with -- larger --;
Line 61, between the words "material" and "bottom", insert -- for the --;
Line 63, the word "late" should be replaced with -- plate --;

Column 3,
Line 2, between the words "the" and "for", insert -- material --;
Line 3, the words "he" should be replaced with -- alloy. The --;
Line 6, the word "Photo phy" should be replaced with -- Photography --;

Column 4,
Line 9, the word "lop" should be replaced with -- top --;

Signed and Sealed this

Fifteenth Day of February, 2005

JON W. DUDAS
*Director of the United States Patent and Trademark Office*